US 6,620,733 B2

(12) United States Patent
Ho

(10) Patent No.: US 6,620,733 B2
(45) Date of Patent: Sep. 16, 2003

(54) USE OF HYDROCARBON ADDITION FOR THE ELIMINATION OF MICROMASKING DURING ETCHING OF ORGANIC LOW-K DIELECTRICS

(75) Inventor: Chok W. Ho, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/782,437

(22) Filed: Feb. 12, 2001

(65) Prior Publication Data

US 2002/0110992 A1 Aug. 15, 2002

(51) Int. Cl.[7] .............................. H01L 21/311
(52) U.S. Cl. ...................... 438/700; 438/694; 438/710
(58) Field of Search ................. 438/694–703, 438/706–744

(56) References Cited

U.S. PATENT DOCUMENTS

| | | | |
|---|---|---|---|
| 5,266,157 A | 11/1993 | Kadomura | 156/659.1 |
| 5,970,376 A | 10/1999 | Chen | 438/637 |
| 6,037,255 A | 3/2000 | Hussein et al. | 438/675 |
| 6,040,248 A | 3/2000 | Chen et al. | 438/725 |
| 6,069,091 A * | 5/2000 | Chang et al. | 438/719 |
| 6,080,529 A | 6/2000 | Ye et al. | 430/318 |
| 6,105,588 A | 8/2000 | Li et al. | 134/1.1 |
| 6,143,476 A * | 11/2000 | Ye et al. | 430/318 |
| 6,153,511 A | 11/2000 | Watatani | 438/623 |
| 6,174,796 B1 | 1/2001 | Takagi et al. | 438/622 |
| 6,194,128 B1 | 2/2001 | Tao et al. | 430/313 |
| 6,265,319 B1 * | 7/2001 | Jang | 438/723 |
| 6,265,320 B1 * | 7/2001 | Shi et al. | 438/725 |
| 6,291,334 B1 * | 9/2001 | Somekh | 438/620 |
| 6,331,380 B1 * | 12/2001 | Ye et al. | 430/318 |
| 6,342,446 B1 * | 1/2002 | Smith et al. | 438/687 |

FOREIGN PATENT DOCUMENTS

| | | | |
|---|---|---|---|
| EP | 0851474 A2 | 7/1998 | H01L/21/321 |
| JP | 62094933 | 5/1987 | H01L/21/302 |
| JP | 01025419 | 1/1989 | H01L/21/302 |
| JP | 01059820 | 3/1989 | H01L/21/302 |
| JP | 09036089 | 2/1997 | H01L/21/3065 |
| WO | WO 00/24048 | 4/2000 | H01L/21/311 |
| WO | WO 00/67308 | 11/2000 | H01L/21/311 |
| WO | 01/29879 A2 | 4/2001 | |

OTHER PUBLICATIONS

Delsol et al., "Transformer Coupled Plasma Dielectric Etch for 0.25 $\mu$m Technologies", Elsevier, Microelectronic Engineering 50 (2000), pp. 75–80.

(List continued on next page.)

Primary Examiner—Amir Zarabian
Assistant Examiner—Jeff Vockrodt
(74) Attorney, Agent, or Firm—Beyer Weaver & Thomas, LLP

(57) ABSTRACT

A method for etching features in an integrated circuit wafer, the wafer incorporating at least one dielectric layer is provided. Generally, the wafer is disposed within a reaction chamber. An etchant gas comprising a hydrocarbon additive and an active etchant is flowed into the reaction chamber. A plasma is formed from the etchant gas within the reaction chamber. The feature is etched in at least a portion of the dielectric layer.

6 Claims, 5 Drawing Sheets

OTHER PUBLICATIONS

Eto et al., "High Selectivity Photoresist Ashing by the Addition of $NH_3$ to $CF_4/O_2$ or $CHF_3/O_2$", SID 99 Digest, pp. 844–847.

Hasegawa et al., "Copper Dual Damascene Interconnects with Low–K ($K_{eff}$<3.0) Dielectrics Using FLARE™ and an Organo–Silicate Hard Mask", 1999, IEEE.

Lin et al., "Microwave Imaging of Cerebral Edema", May 1982, Proceedings of the IEEE, vol. 70, No. 5.

International Search Report, Nov. 20, 2002.

International Search Report, Dec. 12, 2002.

U.S. patent application Ser. No. 09/782,185 entitled "Unique Process Chemistry for Etching Organic Low–K Materials", filed Feb. 12, 2001.

U.S. patent application Ser. No. 09/782,678, entitled "Post–Etch Photoresist Strip with O2 and NH3 for Organo-silicate Glass Low–K Dielectric Etch Applications", filed Feb. 12, 2001.

U.S. patent application Ser. No. 09/782,446, entitled "Use of Ammonia for Etching Organic Low–K Dielectrics", filed Feb. 12, 2001.

Janowiak et al., "Etching of Organic Low Dielectric Constant Material SiLK™ on the Lam Research Corporation 4520XLE™", Jul./Aug. 2000, J. Vac. Sci. Technol. A 18(4), pp. 1859–1863.

International Search Report, Feb. 4, 2003.

* cited by examiner

USE OF HYDROCARBON ADDITION FOR THE ELIMINATION OF MICROMASKING DURING ETCHING OF ORGANIC LOW-K DIELECTRICS

RELATED APPLICATIONS

This application is related to the commonly assigned U.S. patent application Ser. No. 09/782,185 entitled UNIQUE PROCESS CHEMISTRY FOR ETCHING ORGANIC LOW-K MATERIALS, by Helen H. Zhu et al., filed concurrently herewith and incorporated herein by reference.

This application is also related to the commonly assigned U.S. patent application Ser. No. 09/782,678 entitled POST-ETCH PHOTORESIST STRIP WITH O2 AND NH3 FOR ORGANOSILICATE GLASS LOW-K DIELECTRIC ETCH APPLICATIONS, by Rao V. Annapragada et al., filed concurrently herewith and incorporated herein by reference.

This application is also related to the commonly assigned U.S. patent application Ser. No. 09/782,446 entitled USE OF AMMONIA FOR ETCHING ORGANIC LOW-K DIELECTRICS, by Chok W. Ho et al., filed concurrently herewith and incorporated herein by reference.

FIELD OF THE INVENTION

The present invention relates to semiconductor manufacture. More particularly, the present invention relates to the elimination of micromasking during etching of low-k dielectrics during the processing of semiconductor wafers.

BACKGROUND OF THE INVENTION

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-k materials", have been developed. Many of these new dielectrics are organic compounds. In the specification and claims, a low-k material is defined as a material with a dielectric constant "k" that is less than 4.

Low-k materials include, but are specifically not limited to: benzocyclobutene or BCB; Flare™ manufactured by Allied Signal® of Morristown, N.J., a division of Honeywell, Inc., Minneapolis, Minn.; one or more of the Parylene dimers available from Union Carbide® Corporation, Danbury Conn.; polytetrafluoroethylene or PTFE; and SiLK®. One PTFE suitable for IC dielectric application is SPEEDFILM™, available from W. L. Gore & Associates, Inc, Newark, Del. SiLK®, available from the Dow® Chemical Company, Midland, Mich., is a silicon-free BCB.

During semiconductor wafer processing, features of the semiconductor device are defined in the wafer using well-known patterning and etching processes. In these processes a photoresist (PR) material is deposited on the wafer and then is exposed to light filtered by a reticle. The reticle is generally a glass plate that is patterned with exemplary feature geometries that blocked light from propagating through the reticle.

After passing through the reticle, the light contacts the surface of the photoresist material. The light changes the chemical composition of the photoresist material such that a developer can remove a portion of the photoresist material. In the case of positive photoresist materials the exposed regions are removed, and in the case of negative photoresist materials the unexposed regions are removed. Thereafter the wafer is etched to remove the underlying material from the areas that are no longer protected by the photoresist material and thereby define the desired features in the wafer. Low-K organic polymers in general can be etched by oxidation (e.g. oxygen-based) or reduction (e.g. hydrogen-based) chemical processes.

The etching of dielectrics may be advantageously accomplished in a dual-frequency capacitively-coupled, (DFC) dielectric etch system. One such is Lam® Research model 4520XLE™ and Exelan-HP™, available from Lam® Research Corporation, Fremont Calif. The 4520XLE™ system processes an extremely comprehensive dielectric etch portfolio in one system. Processes include contacts and vias, bilevel contacts, borderless contacts, nitride and oxide spacers, and passivation.

Advanced etch systems like the 4520XLE™ perform several processes in the same system. By performing many different semiconductor fabrication steps in a single system, wafer throughput can be increased. Even further advanced systems contemplate the performance of additional steps within the same equipment. Again by way of example, but not limitation, Lam™ Research Corporation's Exelan™ system is a dry etch system capable of performing many process steps in a single apparatus. Exelan™ enables hard-mask open, inorganic and organic ARC etch, and photoresist strip to be performed in situ with a single chamber. This system's extensive process portfolio includes all dual damascene structures, contacts, vias, spacers, and passivation etch in doped and undoped oxides and low-k dielectrics required in the sub-0.18 micron environment. Of course, the principles enumerated herein may be implemented in wide variety of semiconductor fabrication systems, and these principles specifically contemplate all such alternatives.

As used herein, the term in situ refers to one or more processes performed on a given substrate, such as a silicon wafer, in the same piece of semiconductor fabrication equipment without removing the substrate from the equipment.

Many current integrated circuit fabrication technologies utilize a photoresist stripping step following one or more of the patterning steps used to form the features in the wafer. Because many photoresists have similar chemical compositions with respect to low-k dielectrics, especially organic low-k dielectrics, such as SiLK, in order to ensure good dimensional control during the etching of a feature in a wafer, a hard mask is often employed beneath the photoresist.

An example wafer stack incorporating a hard mask layer is shown at FIG. 1A. The wafer, 1, having a patterned layer of photoresist, 10, is shown. In this example, wafer 1 includes a silicon substrate, 22 having deposited thereon a silicon carbide or silicon nitride barrier layer, 20. Deposited over barrier layer 20 is a first layer 18 of organosilicate dielectric, for instance Novellus Coral™. A metalized structure, not shown, may be formed under the first layer of organosilicate dielectric. A thin silicon carbide trench stop layer 16 is disposed between first blank layer 18 to form a dual damascene structure, not shown. A second blank layer, 14, also of Coral™ is deposited over trench stop layer 16. A hard mask layer 12 is deposited over second organosilicate layer 14, completing the example in wafer stack. Hard mask may be formed of SiO2, Si3N4, or other hard mask materials, especially inorganic hard mask materials. Patterned photoresist layer 10, previously discussed, is applied over hard mask 12. Of course, it will be recognized by those having skill in the art that this wafer stack is exemplary only. Alternative structures and films, known to those having skill in the art may be utilized to implement alternative integrated circuit designs.

Having reference now to FIG. 1B, as etching proceeds, especially the etching of low-K OSG dielectric layers 14 and 18, as shown in FIG. 1B, photoresist layer 10 is etched away, exposing portions of hard mask layer 12, beneath. As etching continues, ion bombardment of the hard mask layer also sputters away a portion of hard mask layer 12. Some of the sputtered hard mask material is re-deposited on surface of the wafer and throughout the reaction chamber. Section "A" is enlarged at FIG. 1C. At least some of this sputtered material is further deposited at the bottom of etched features during etching, as shown at 36, in FIG. 1C. The amount of micromasking increases with increased ion density and ion energy. Micromasking is more evident in large feature sizes and in opened areas.

With reference to FIG. 1C, a feature is shown being etched through the organic low-k dielectric layers 14 and 18, such as SiLK and through etch stop layer 20. The hard mask material re-deposited at 36 is seen in photomicrographs to form spicules 34 of hard mask material. The visual appearance of this material gives rise to one nickname therefor: "grass", and it is the sputtered hard mask that micromasks the SiLK, which forms the "grass". The micromask of course not only slows the etch rate of the feature, but it can render the etching of the feature erratic and irregular, leading in extreme cases to poor profile control and yield reduction.

Fluorine, F, may be added to etchant gasses during etching to mitigate the effects of grass. A problem may exist with the use of fluorine. First, the use of fluorine may have a negative impact on critical dimension, CD, control during etching. This is because fluorine may cause lateral etching of both the hardmask material and the organic low-K material.

What is desirable is a methodology which mitigates, and preferably eliminates the formation of grass during etching of features in integrated circuits while maintaining good CD control during that etching.

Finally, it would be very desirable if the these advantages could be implemented using existing integrated circuit manufacturing equipment.

These and other features of the present invention will be described in more detail in the section entitled detailed description of the preferred embodiments and in conjunction with the following figures.

SUMMARY OF THE INVENTION

To achieve the foregoing and other objects and in accordance with the purpose of the present invention for etching a feature in an integrated circuit wafer, the wafer incorporating at least one dielectric layer, generally, is disposed within a reaction chamber. An etchant gas comprising a hydrocarbon additive and an active etchant is flowed into the reaction chamber. A plasma is formed from the etchant gas within the reaction chamber. The feature is etched in at least a portion of the dielectric layer.

Several sources of appropriate hydrocarbon are identified as suitable to practice the present invention. These include, but are specifically not limited to: ethylene, $C_2H_4$; ethane, $C_2H_6$; and methane, $CH_4$.

BRIEF DESCRIPTION OF THE DRAWING

For more complete understanding of the present invention, reference is made to the accompanying Drawing in the following Detailed Description of the Preferred Embodiments. In the drawing.

Figure 1A:
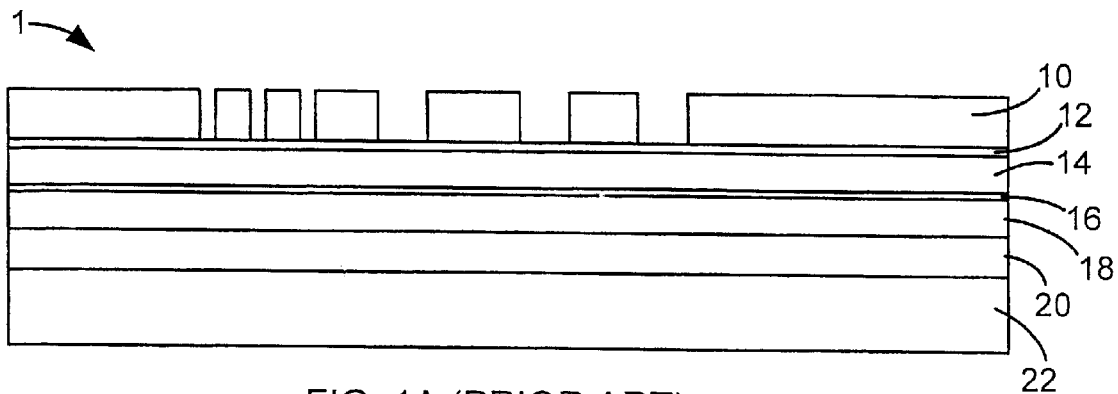
FIG. 1A is an schematic cross-sectional view of a wafer before etching.
Figure 1B:
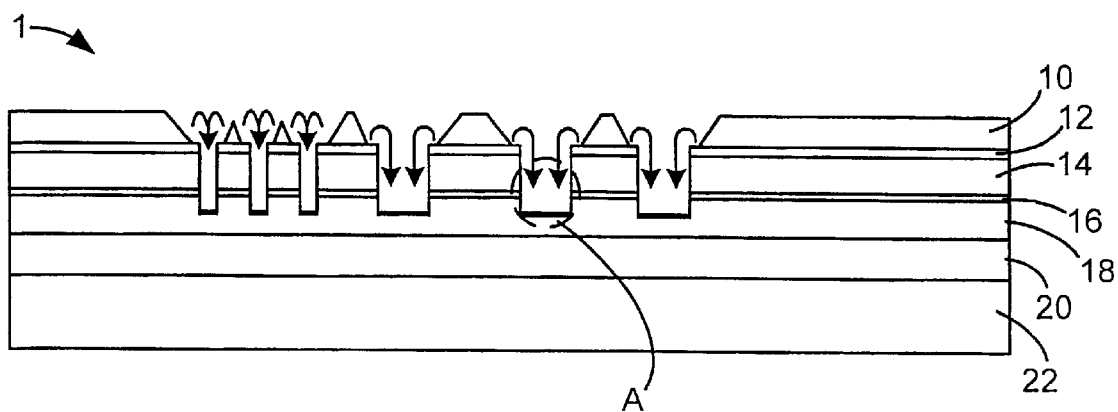
FIG. 1B is a schematic cross-sectional view of the wafer shown in FIG. 1A during an etch using a prior art etching method.

Reference numbers refer to the same or equivalent parts of the invention throughout the several figures of the Drawing.

DETAILED DESCRIPTION OF THE PREFERRED EMBODIMENTS

The present invention teaches a novel etch chemistry incorporating a hydrocarbon additive for etching a wide variety of feature sizes and shapes in wafers incorporating. Such wafers may incorporate low-k dielectrics, especially dielectrics of an organic material, such as SiLK, but the invention may also be used for etching other dielectrics. The methodology taught herein eliminates the formation of micromasking from sputtered hardmask components during etching. The methodology taught herein further results in minimal RIE lag, minimal bowing of the vias and trenches formed by the etch process, good etch profiles, good resist selectivity, good etch rates, good CD control, and good etch uniformity across the wafer.

In order to etch a variety of features, including but specifically not limited to trenches and vias, in wafers including organic low-k dielectric, such as SiLK, layers the present invention implements the use of a hydrocarbon, for instance $CH_4$, $C_2H_4$, and $C_2H_6$, as an additive during etching. The invention may provide a $C_2H_4/H_2/N_2$ etchant gas, or a $C_2H_4/NH_3$ etchant gas, or a $C_2H_4/O_2/N_2$ etchant gas.

Figure 2:
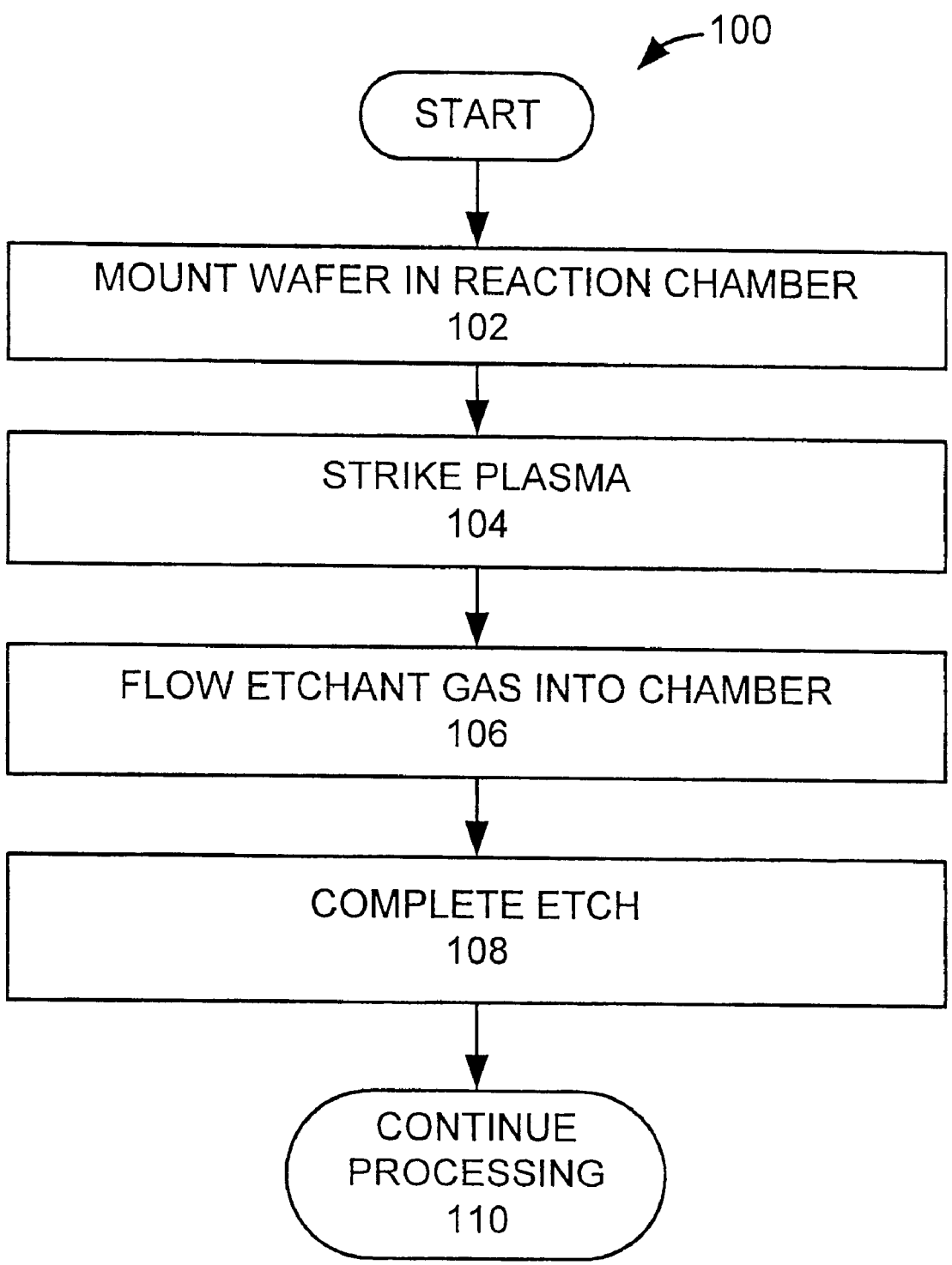
FIG. 2 is a high level flow chart of an embodiment of the invention.

Having reference to FIG. 2, in order to practice the process, 100, of the present invention a wafer is situated within a reaction vessel capable of forming an etch plasma (step 102). This reaction vessel or chamber may be an item of single purpose etching equipment, or may be a multiple purpose wafer processing system. One equipment particularly well suited for practicing the present invention is the Exelan™ system dry etch system, available from Lam Research Corporation, Fremont, Calif. Exelan™ is capable of performing hardmask open, inorganic and organic ARC etch, and photoresist strip in situ within a single chamber. Alternative equipment may of course be utilized.

The wafer, previously having had a layer of patterned photoresist applied to let upper surface thereof, is mounted within the chamber (step 102), and an etch plasma struck at (step 104). A flow of etchant gas is introduced into the chamber (step 106). The etchant includes at least one hydrocarbon including, but specifically not limited to those selected from the group consisting of methane $CH_4$, ethane $C_2H_6$, and ethylene $C_2H_4$ and an active etchant. The active etchant may comprise oxygen, hydrogen, ammonia, or other etchants known by those of ordinary skill in the art to be effective for the particular dielectric being etched. The plasma may be struck before the introduction of the etchant gas, if other plasma processes are performed before the dielectric etch. However, in other embodiments the etchant gas may be introduced before the plasma is struck so that the plasma is struck using the etchant gas.

Once the desired feature has been completed (step 108), the wafer is available for further processing as required (step 110).

While the succeeding discussion of certain preferred embodiments are centered around a single etching step, it will be understood by those having skill in the art that the present invention may conveniently be implemented as part of a multi-step etch regime. The present invention specifically contemplates all such multi-step etch regimes, including dielectric etch regimes, incorporating the principles enumerated herein.

Figure 3A:
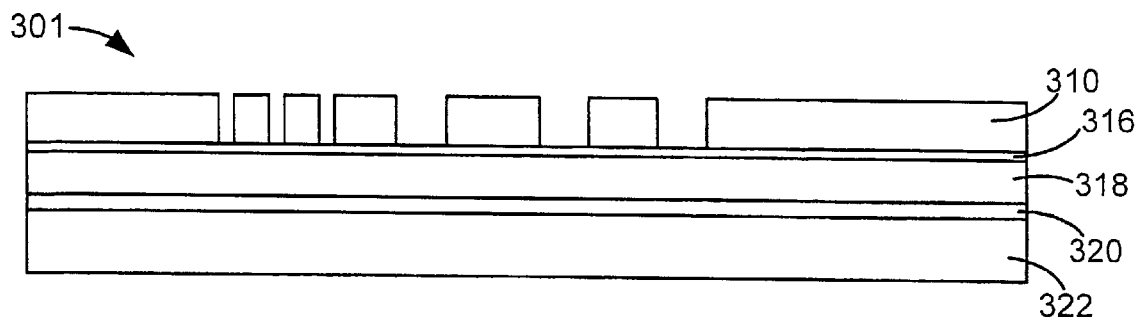
FIG. 3A is an schematic cross-sectional view of a wafer before etching.

Having reference now to FIG. 3A, an example wafer, 301, having a patterned layer of photoresist, 310, is shown. In this example, wafer 301 includes a silicon substrate 322 having deposited thereon a silicon carbide or silicon nitride barrier layer, 320. Deposited over barrier layer 320 is a dielectric layer 318, which may be of an organic low-k dielectric such as Dow® Chemical Company Silk™. A metalized structure, not shown, may be formed under the barrier layer 320. A hard mask layer 316 of SiO2 is deposited over dielectric layer 318, completing the example in wafer stack. Patterned photoresist layer 310, previously discussed, is applied over hard mask 316. Of course, it will be recognized by those having skill in the art that this wafer stack is exemplary only. Alternative structures and films, known to those having skill in the art may be utilized to implement alternative integrated circuit designs.

The wafer 301 is situated within the reaction chamber (step 102). The etch plasma is struck (step 104). A flow of an etchant gas including a hydrocarbon additive is introduced into the chamber (step 106). According to one embodiment, this etchant gas is a mixture including nitrogen, $N_2$, hydrogen, $H_2$, and ethylene, $C_2H_4$. This mixture is of course highly application specific, and alternative etch steps implementing alternative etchants and diluents may be used either before or after an etch step incorporating a hydrocarbon according to the present invention.

Figure 3B:
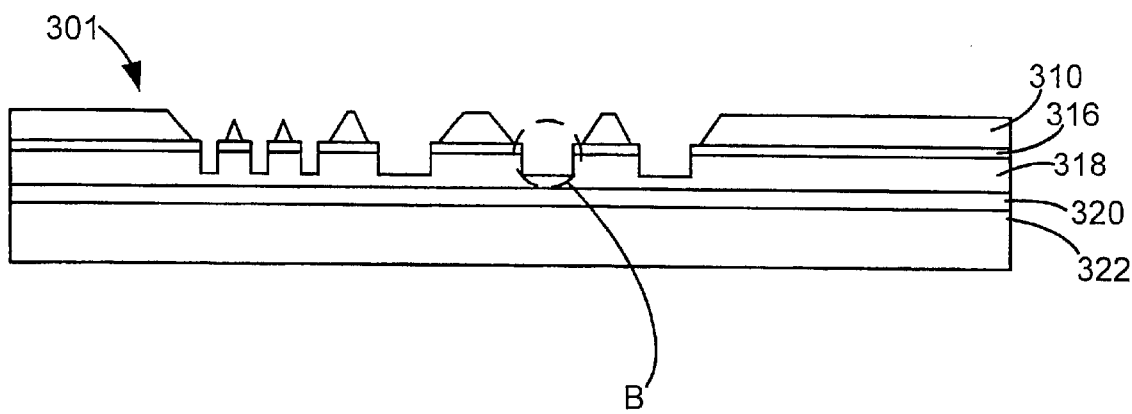
FIG. 3B is a schematic cross-sectional view of the wafer shown in FIG. 3A during an etch using a preferred embodiment of the invention.
Figure 3C:
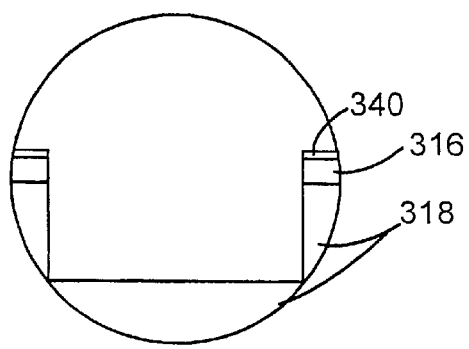
FIG. 3C is an enlarged cross-sectional view of section B of FIG. 3B.

Having reference now to FIG. 3B, as etching proceeds, especially the etching of the dielectric layer 318, as shown in FIG. 3B, photoresist layer 310 is etched away, exposing portions of hard mask layer 316, beneath. Section "B" is enlarged at FIG. 3C. The hydrocarbon additive forms a thin layer 340 over the hardmask layer 316 and the photo resist layer 310, which helps to prevent the sputtering of the hardmask layer 316. By preventing or significantly reducing the sputtering of the hardmask layer 316, the inventive method prevents or significantly reduces micromasking and "grass" at the bottom of the feature, as shown in FIG. 3C, providing a more uniform and regular etch.

In general a power source with a frequency from about 10 MHz to about 60 MHz may provide upper frequency power level. More preferably the upper frequency power level has a frequency between 20 MHz to 35 MHz. Most preferably the upper frequency power level has a frequency between 25 MHz and 30 MHz. In the preferred embodiment, the upper frequency power level has a frequency of about 27 MHz. The upper frequency power for the dielectric etch is from about 250 W to about 2500 W. More preferably, the upper frequency power level is formed from about 250 W to about 1500 W. More preferably still, the upper frequency power level is set at between about 500 to about 900 W. Most preferably the upper frequency power is set at about 700 W.

In general a power source with a frequency from about 0.25 MHz to about 7 MHz may provide lower frequency power level. More preferably the lower frequency power level has a frequency between 0.5 MHz to 4 MHz. Most preferably the lower frequency power level has a frequency between 1 MHz and 3 MHz. In the preferred embodiment, the lower frequency power level is about 2 MHz. The lower frequency power level is set from about 0 W to about 100 W. More preferably, the lower frequency power level is from about 0 W to about 50 W. More preferably still, the lower frequency power level is set at between about 0 to about 25 W. Most preferably the lower frequency power is set at about 0 W.

The etchant gas comprises active etchants and a hydrocarbon additive. The hydrocarbon may be a hydrocarbon selected from the group consisting of methane $CH_4$, ethane $C_2H_6$, and ethylene $C_2H_4$. The ratio of the sccm flow of active etchants to the sccm flow of hydrocarbon additives is from 10,000:1 to 100:50. More preferably, the ratio of the sccm flow of active etchants to the sccm flow of hydrocarbon additives is from 1,000:1 to 500:25. Most preferably, the ratio of the sccm flow of active etchants to the sccm flow of hydrocarbon additives is from 1,000:2 to 1,000:15. Preferably, at least 1 sccm of a hydrocarbon additive is provided. More preferably, between 3 and 300 sccm of a hydrocarbon additive is provided. Most preferably, between 5 and 10 sccm of a hydrocarbon additive is provided.

Etching proceeds at a controlled temperature, for a specified period of time. In the example under discussion, the first etch may proceed at temperatures between 0° C. and 60° C. More particularly from about 5° C. to about 50° C. More particularly still, from about 7° C. to about 40° C. Again, to accomplish the preceding temperature control, the temperature of the wafer is thermally maintained by a flow of coolant gas through the chuck, sometimes referred to as an electrostatic chuck (ESC), retaining the wafer in the reaction vessel. This flow of coolant gas, for instance helium, is at a flow rate from about 1 sccm to about 100 sccm, more preferably from about 2 sccm to about 50 sccm, more preferably still from about 10 sccm to about 40 sccm and most preferably at about 31 sccm.

Etch times may further vary from small fractions of a second to about 10 minutes, and are situation dependent. In the example presented here, etching at the most preferable power settings, gas flows and temperature, the etch was accomplished in about 60 seconds.

EXAMPLES

Figure 4A:
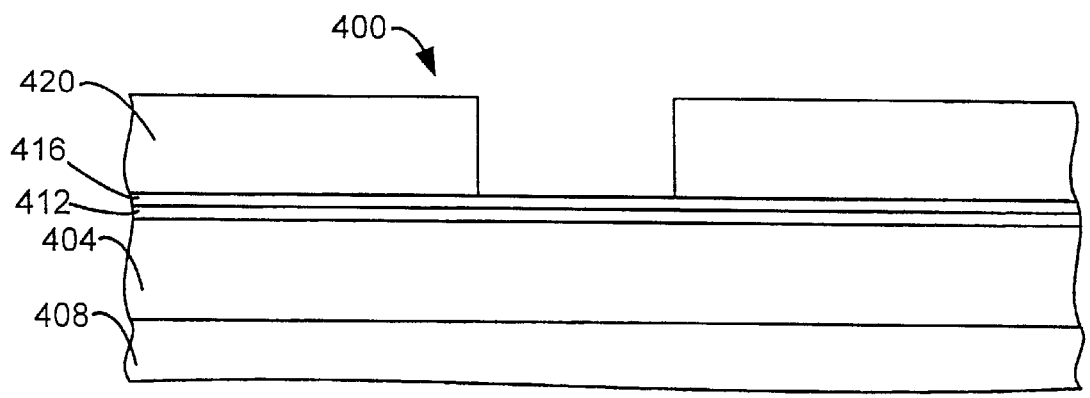
FIG. 4A is a schematic cross-section of a wafer that may be used in a test etch.

Tests were run to verify the working of the invention. FIG. 4A is a schematic cross-section of a wafer that may be used in a test etch. The wafer 400 in FIG. 4A comprises a dielectric layer 404 placed over a substrate 408. In this example, the dielectric layer 404 is Flare™. In this example, a hardmask layer 412 is placed over the dielectric layer 404. A bottom antireflective coating (BARC) 416 is placed over the hardmask layer 412. A photoresist mask 420 is placed over the hardmask layer 412.

Figure 4B:
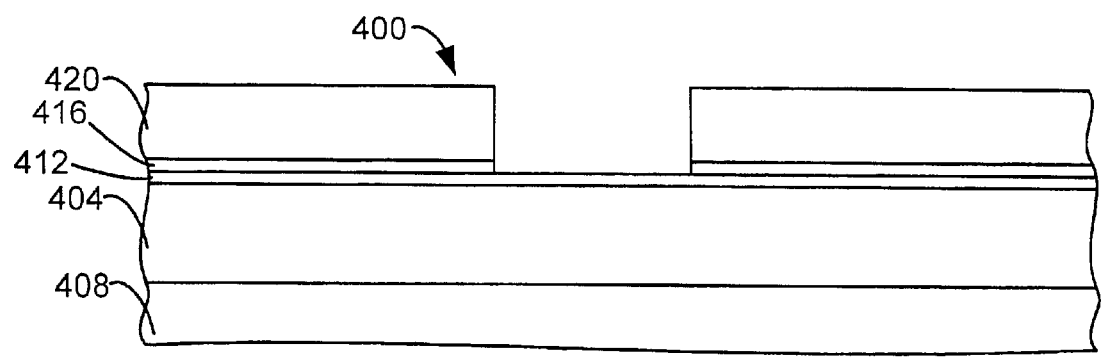
FIG. 4B is a schematic cross-section of the wafer of FIG. 4A after the antireflective coating has been etched.
Figure 4C:
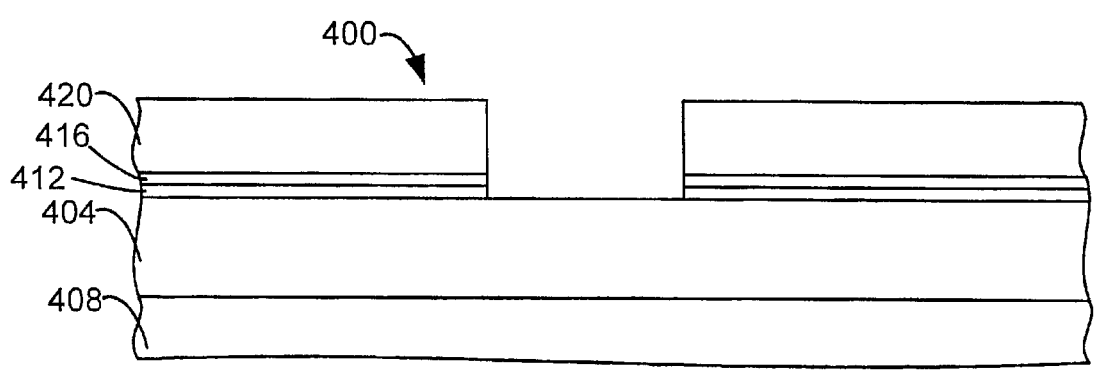
FIG. 4C is a schematic cross-section of the wafer of FIG. 4B after the hardmask layer has been etched.
Figure 4D:
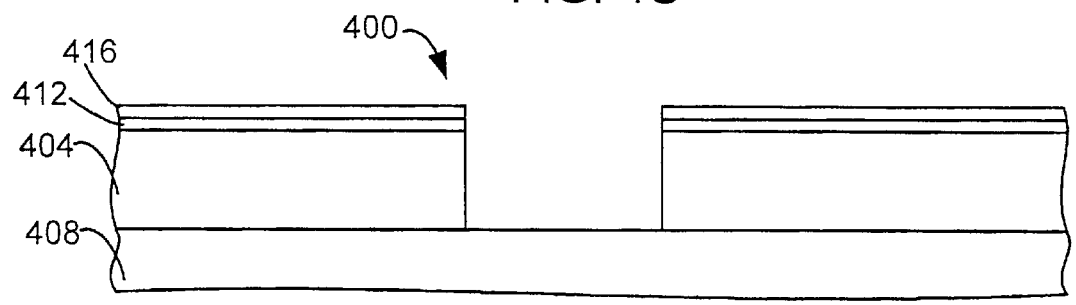
FIG. 4D is a schematic cross-section of the wafer of FIG. 4C after the dielectric layer has been etched.
Figure 5:
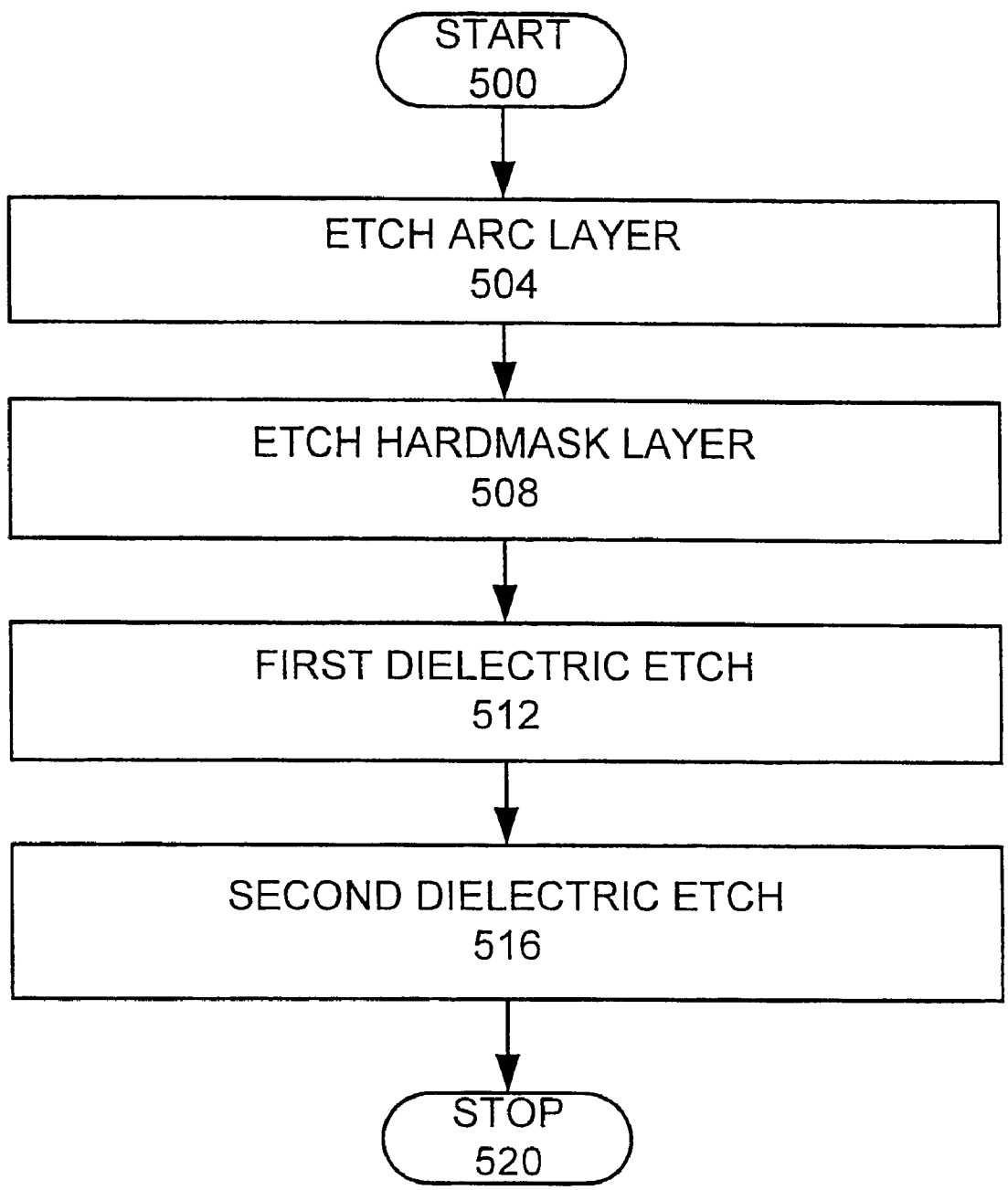
FIG. 5 is a flow chart of the process used in three test examples.

FIG. 5 is a flow chart of the process used in three examples. In all three examples first the antireflective coating (ARC), which in this example is a BARC 416, is etched (step 504). FIG. 4B is a schematic cross-section of the wafer of FIG. 4A after the antireflective coating 416 has been etched. Next, the hardmask layer 412 is etched (step 508). FIG. 4C is a schematic cross-section of the wafer of FIG. 4B after the hardmask layer 412 has been etched. Next, a first dielectric etch is performed (step 512) on the dielectric layer 404. Finally, a second dielectric etch is performed (516) on the dielectric layer 404, to complete an etch of the dielectric layer 404. During the first and second dielectric etches the photoresist layer 420 may be etched away due to the similarities between the photoresist layer 420 and the dielectric layer 404 causing a low selectivity between the photoresist layer 420 and the dielectric layer 404. FIG. 4D is a schematic cross-section of the wafer of FIG. 4C after the dielectric layer 404 has been etched.

In all three examples, the etching of the antireflective coating (step 504) is performed at a pressure of 70 millitorr. A 27 MHz power source connected to either or both an upper and lower electrode is used to provide an upper frequency power. The upper frequency power level is provided at 500 Watts. A 2 MHz power source connected to either or both the upper and lower electrode is used to provide a lower frequency power. The lower frequency power level is 1000 Watts. An etchant gas comprises a diluent, which is argon, Ar, and active etchants, which are oxygen, $O_2$, $C_4F_8$ and $CF_4$. Ar is provided at a flow rate of about 160 sccm. $O_2$ is provided at 15 sccm. $C_4F_8$ is provided at 5 sccm. $CF_4$ is provided at 40 sccm. The ESC is maintained at about 0° C. This step may be continued until the antireflective coating 416 is etched through.

In all three examples, the etching of the hardmask coating (step 504) is performed at a pressure of 55 millitorr. The upper frequency power level is provided at 1400 Watts. The lower frequency power level is 1000 Watts. An etchant gas comprises a diluent, which is argon, Ar, and active etchants, which are oxygen, $O_2$ and $C_4F_8$. Ar is provided at a flow rate of about 140 sccm. $O_2$ is provided at 9 sccm. $C_4F_8$ is provided at 15 sccm. The ESC is maintained at about 0° C. This step may be continued until the hardmask layer 412 is etched through.

Example 1
Control Test without Hydrocarbon Additive

In the first example, the etching of the first dielectric etch (step 512) is performed at a pressure of 160 millitorr. The upper frequency power level is provided at 700 Watts. The lower frequency power level is 0 W. An etchant gas comprises a diluent, argon, Ar, and active etchants nitrogen, $N_2$ and hydrogen, $H_2$. Ar is provided at a flow rate of about 100 sccm. $N_2$ is provided at 750 sccm. $H_2$ is provided at 250 sccm. The ESC is maintained at about 0° C. This step may be continued until the dielectric layer 404 is partially etched through.

A second dielectric etch (step 516) is performed at a pressure of 160 millitorr. The upper frequency power level is provided at 700 Watts. The lower frequency power level is 0 W. An etchant gas comprised of active etchants nitrogen, $N_2$, and hydrogen, $H_2$. $N_2$ is provided at 750 sccm. $H_2$ is provided at 250 sccm. The ESC is maintained at about 0° C. This step may be continued until the dielectric layer 404 is completely etched through.

Figure 1C:
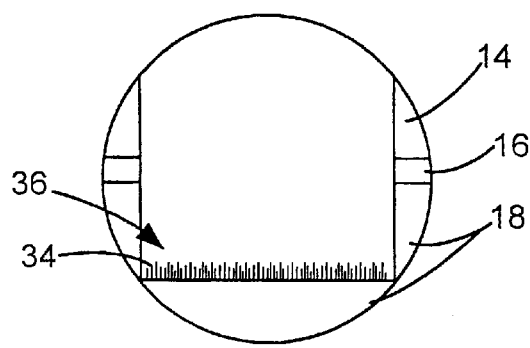
FIG. 1C is an enlarged cross-sectional view of section A of FIG. 1B.

In this example, the etch rate of the dielectric is 2128 Angstroms/minute. The etch rate uniformity was less than 2.4%. The RIE lag was greater than −4.4%. This example caused a significant amount of micromasking and resulting grass, as shown in FIG. 1C.

Example 2
Test with Hydrocarbon Additive

In the second example, the etching of the first dielectric etch (step 512) is performed at a pressure of 160 millitorr. The upper frequency power level is provided at 700 Watts. The lower frequency power level is 0 W. An etchant gas comprises a diluent, which is argon, Ar, and active etchants, which are nitrogen, $N_2$, and hydrogen, $H_2$, and a hydrocarbon additive of $C_2H_4$. Ar is provided at a flow rate of about 100 sccm. $N_2$ is provided at 750 sccm. $H_2$ is provided at 250 sccm. $C_2H_4$ is provided at a flow rate of 5 sccm. The ESC is maintained at about 0° C. This step may be continued until the dielectric layer 404 is partially etched through.

A second dielectric etch (step 516) is performed at 160 millitorr. The upper frequency power level is provided at 700 Watts. The lower frequency power level is 0 W. An etchant gas comprised of active etchants nitrogen, $N_2$ and hydrogen, $H_2$, and a hydrocarbon additive of $C_2H_4$. $N_2$ is provided at 750 sccm. $H_2$ is provided at 250 sccm. $C_2H_4$ is provided at 5 sccm. The ESC is maintained at about 0° C. This step may be continued until the dielectric layer 404 is completely etched through.

In this example, the etch rate of the dielectric is 1797 Angstroms/minute. The etch rate uniformity was less than 3.6%. The RIE lag was greater than −9.4%. This example significantly reduced or eliminated the amount of micromasking and resulting grass, providing features without grass, as shown in FIG. 3C.

Example 3
Test with Hydrocarbon Additive

In the third example, the etching of the first dielectric etch (step 512) is performed at a pressure of 160 millitorr. The upper frequency power level is provided at 700 Watts. The lower frequency power level is 0 W. An etchant gas comprised of a diluent argon, Ar, and active etchants nitrogen, $N_2$ and hydrogen, $H_2$, and a hydrocarbon additive of $C_2H_4$. Ar is provided at a flow rate of about 100 sccm. $N_2$ is provided at 750 sccm. $H_2$ is provided at 250 sccm. $C_2H_4$ is provided at a flow rate of 10 sccm. The ESC is maintained at about 0° C. This step may be continued until the dielectric layer 404 is partially etched through.

A second dielectric etch (step 516) is performed at 160 millitorr. The upper frequency power level is provided at 700 Watts. The lower frequency power level is 0 W. An etchant gas comprised of active etchants nitrogen, $N_2$ and hydrogen, $H_2$, and a hydrocarbon additive of $C_2H_4$. $N_2$ is provided at 750 sccm. $H_2$ is provided at 250 sccm. $C_2H_4$ is provided at 10 sccm. The ESC is maintained at about 0° C. This step may be continued until the dielectric layer 404 is completely etched through.

In this example, the etch rate of the dielectric is 1590 Angstroms/minute. The etch rate uniformity was less than 4.2%. The RIE lag was greater than −17.6%. This example significantly reduced or eliminated the amount of micromasking and resulting grass, providing features without grass, as shown in FIG. 3C.

The inventive process provides several novel advantages. First among these is the fact that etching proceeds without the effects of the previously discussed micromasking slowing the etch down. Of course, alternative embodiments of different materials having different thicknesses, or performed with different process parameters, may produce greater or lower etch rates.

A second advantage is the extraordinary degree of control of profile control enabled by the methodology of the present invention.

Without being bound by theory, it is believed that the hydrocarbon additive forms a polymer, which is simultaneously and continuously formed from the hydrocarbon additive and deposited on the surface of the photoresist mask and/or hardmask layer and etched away during the etching. This polymer reduces the effective energy of the incident ions to the hardmask layer, thereby eliminating or at least seriously reducing sputtering of the hardmask, thus eliminating or at least seriously reducing the micromasking effect.

The invention may be most useful for etching a low-k organic dielectric layer, since such layers may have the similar properties with the photoresist so that the etching selectivity between the low-k organic dielectric layer and the photoresist layer may be very close to one. As a result the photoresist layer may be etched away during the etching. For this reason, a hard mask layer is used to provide patterning to maintain critical dimensions after the photoresist layer has been etched away. Once the photoresist layer has been etched down to the hardmask without the presence of the hydrocarbon additive, the hard mask would be sputtered. The hydrocarbon additive forms a layer that helps to significantly reduce the sputtering of the hardmask. In other embodiments, where the etch mask is a hardmask alone, it would be desirable to use a hydrocarbon additive, even if the dielectric layer is not low-k or is inorganic.

By maintaining the ion density and ion energy at a low enough level, fluorine is not required to eliminate grass. At high ion densities fluorine may be required to form volatile by products with sputtered materials, so that the volatile by products may be removed from the chamber without redepositing. But at low ion densities, the hydrocarbon alone may sufficiently prevent sputtering. The lower ion densities are achieved by having lower power to the plasma. By providing only a high frequency (on the order of 27 MHz) power and providing no low frequency (on the order of 2 MHz) power the ion energy may be kept low, since ion energy is increased by the low frequency power. The reduction in plasma density causes a lowering of the etch rate, but still may provide a satisfactory etch rate. Part of the reason for why the lower etch rate may be satisfactory is that the low-k dielectric layer may be thin.

Since fluorine is not used in the invention, critical dimensions control may be improved and bowing may be reduced.

A specific feature of the present invention is its novel ability to form features of widely varying size contemporaneously, with excellent profile control and with minimal RIE lag, minimal bowing of the vias formed by the etch process, good etch profiles, good resist selectivity, and good etch uniformity across the wafer, while eliminating or significantly reducing micromasking and grass.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching a feature in a dielectric layer of a wafer, the method comprising:

disposing the wafer within a reaction chamber;

introducing a flow of an etchant gas comprising a hydrocarbon additive and an active etchant into the reaction chamber, wherein the hydrocarbon is selected from a group consisting of $CH_4$, $C_2H_4$, and $C_2H_6$, wherein the hydrocarbon has a flow rate of at least 1 sccm, wherein a ratio of the flow of active etchant to the flow of hydrocarbon additive is from 10,000:1 to 100:50, wherein if the active etchant includes nitrogen gas then the etchant gas must also include a reducing gas;

forming a plasma from the etchant gas within the reaction chamber;

etching the feature in at least a portion of the dielectric layer, wherein the dielectric layer is below a hardmask layer; and simultaneously forming from the hydrocarbon and etching away a polymer layer above the hardmask layer to reduce hardmask sputtering.

2. The method, as recited in claim 1, wherein the hydrocarbon has a flow rate between 3 and 30 sccm.

3. The method, as recited in claim 2, wherein the hardmask is disposed below a photoresist mask and wherein the dielectric layer is an organic dielectric layer.

4. The method, as recited in claim 3, further comprising performing a hard mask etch.

5. The method, as recited in claim 1, wherein a ratio of the flow of active etchant to the flow of hydrocarbon additive is from 1,000:1 to 500:25.

6. The method, as recited in claim 1, wherein a ratio of the flow of active etchant to the flow of hydrocarbon additive is from 1,000:2 to 1,000:15.

* * * * *